US012444726B2

United States Patent
Kawasaki et al.

(10) Patent No.: US 12,444,726 B2
(45) Date of Patent: Oct. 14, 2025

(54) ACTIVE PHASED ARRAY ANTENNA COMPRISING A PSEUDO WAFER INCLUDING MULTIPLE FEEDERS

(71) Applicant: Mitsubishi Electric Corporation, Tokyo (JP)

(72) Inventors: Kengo Kawasaki, Tokyo (JP); Akihito Hirai, Tokyo (JP); Shinya Yokomizo, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 442 days.

(21) Appl. No.: 18/076,688

(22) Filed: Dec. 7, 2022

(65) Prior Publication Data

US 2023/0099900 A1 Mar. 30, 2023

Related U.S. Application Data

(63) Continuation of application No. PCT/JP2020/029486, filed on Jul. 31, 2020.

(51) Int. Cl.
*H01L 25/18* (2023.01)
*H01L 23/538* (2006.01)
(Continued)

(52) U.S. Cl.
CPC .......... *H01L 25/18* (2013.01); *H01L 23/5389* (2013.01); *H01L 25/0652* (2013.01);
(Continued)

(58) Field of Classification Search
CPC ... H01L 25/18; H01L 23/5389; H01L 25/105; H01L 23/49816; H01L 23/3677;
(Continued)

(56) References Cited

U.S. PATENT DOCUMENTS

2002/0064906 A1   5/2002   Enquist
2002/0164839 A1   11/2002  Enquist
(Continued)

FOREIGN PATENT DOCUMENTS

DE   10 2019 124 237 A1   7/2020
JP   2015-84421 A         4/2015

OTHER PUBLICATIONS

European Communication pursuant to Article 94(3) EPC for European Application No. 20 947 073.1, dated Feb. 15, 2024.
(Continued)

*Primary Examiner* — Thanh Y. Tran
(74) *Attorney, Agent, or Firm* — Birch, Stewart, Kolasch & Birch, LLP

(57) ABSTRACT

There is provided an active phased array antenna in which power to an Si wafer is separated from power to compound semiconductor chips. An active phased array antenna is an active phased array antenna including a substrate having a plurality of antenna elements; a pseudo wafer containing a group of semiconductor chips including a plurality of semiconductor chips made of compound semiconductors; and a silicon wafer made of silicon, the substrate, the pseudo wafer, and the silicon wafer being stacked on top of each other in this order, and the pseudo wafer includes first feeders for supplying power to the group of semiconductor chips from the substrate; and a second feeder for supplying power to the silicon wafer from the substrate, the second feeder passing through the pseudo wafer in a thickness direction of the pseudo wafer.

14 Claims, 8 Drawing Sheets

(51) Int. Cl.
  *H01L 25/065* (2023.01)
  *H01L 25/10* (2006.01)
  *H01Q 1/22* (2006.01)
  *H01L 23/498* (2006.01)

(52) U.S. Cl.
  CPC ......... *H01L 25/105* (2013.01); *H01Q 1/2283* (2013.01); *H01L 23/49816* (2013.01)

(58) Field of Classification Search
  CPC ............ H01L 24/96; H01L 2223/6616; H01L 2223/6677; H01L 2224/06181; H01L 2224/2518; H01L 2225/1058; H01Q 1/2283
  See application file for complete search history.

(56) References Cited

U.S. PATENT DOCUMENTS

| | | |
|---|---|---|
| 2003/0119279 A1 | 6/2003 | Enquist |
| 2020/0212537 A1 | 7/2020 | Chuang et al. |
| 2020/0258924 A1* | 8/2020 | Takachi ................. H04N 25/70 |
| 2023/0104551 A1 | 4/2023 | Chuang et al. |

OTHER PUBLICATIONS

International Search Report, issued in PCT/JP2020/029486, PCT/ISA/210, dated Oct. 6, 2020.
Written Opinion of the International Searching Authority, issued in PCT/JP2020/029486, PCT/ISA/237, dated Oct. 6, 2020.

* cited by examiner

ACTIVE PHASED ARRAY ANTENNA COMPRISING A PSEUDO WAFER INCLUDING MULTIPLE FEEDERS

CROSS REFERENCE TO RELATED APPLICATIONS

This application is a Continuation of PCT International Application No. PCT/JP2020/029486 filed on Jul. 31, 2020, which is hereby expressly incorporated by reference into the present application.

TECHNICAL FIELD

The present disclosure relates to an active phased array antenna.

BACKGROUND ART

FIG. 21 of Patent Literature 1 and description of a specification related to FIG. 21 disclose an antenna having a 3D structure in which a substrate (150), a high-density, low-speed silicon IC device (151), an insulating substrate (152), a low-density, high-speed device (153), and a substrate (154) having patch antennas (159) are stacked on top of each other in this order. The high-density, low-speed silicon IC device has elements (155) and wiring lines (156). The low-density, high-speed device has heterojunction bipolar transistors formed thereon.

CITATION LIST

Patent Literatures

Patent Literature 1: JP 2015-84421 A

SUMMARY OF INVENTION

Technical Problem

According to the antenna disclosed in this Patent Literature 1, the area of each compound semiconductor IC chip (157) arranged at a low density is larger than the area of each of the silicon IC chips (155) arranged at a high density. Hence, when power is supplied to a silicon wafer (Si wafer) from the substrate having the antennas, it is difficult to provide a feeder that directly connects the substrate having the antennas to the silicon wafer. This necessitates an area for feeding that is provided on the device having the compound semiconductor IC chips mounted thereon, which causes the compound semiconductor IC chips and the Si wafer to share power. Thus, there is a problem that there is a possibility of power supply to the Si wafer becoming unstable due to heat generated upon operation of the compound semiconductor IC chips.

The present disclosure is made to solve a problem such as that described above, and an object of one aspect of embodiments is to provide an active phased array antenna having a 3D structure in which power to an Si wafer is separated from power to compound semiconductor chips.

Solution to Problem

One aspect of an active phased array antenna of an embodiment is an active phased array antenna including a substrate having a plurality of antenna elements; a pseudo wafer containing a group of semiconductor chips including a plurality of semiconductor chips made of compound semiconductors; and a silicon wafer made of silicon, the substrate, the pseudo wafer, and the silicon wafer being stacked on top of each other in this order, and the pseudo wafer includes first feeders to supply power to the group of semiconductor chips from the substrate; and a second feeder to supply power to the silicon wafer from the substrate, the second feeder passing through the pseudo wafer in a thickness direction of the pseudo wafer.

Another aspect of an active phased array antenna of an embodiment is an active phased array antenna including a substrate having a plurality of antenna elements formed thereon; a first pseudo wafer containing a first group of semiconductor chips including a plurality of semiconductor chips made of compound semiconductors; a second pseudo wafer containing one or more silicon wafers made of silicon; and a third pseudo wafer containing a second group of semiconductor chips including a plurality of semiconductor chips made of compound semiconductors, the substrate, the first pseudo wafer, the second pseudo wafer, and the third pseudo wafer being stacked on top of each other in this order, and the first pseudo wafer includes first feeders to supply power to the first group of semiconductor chips from the substrate; a second feeder to supply power to the one or more silicon wafers from the substrate, the second feeder passing through the first pseudo wafer in a thickness direction of the first pseudo wafer; and a third feeder to supply power to the second group of semiconductor chips from the substrate, the third feeder passing through the first pseudo wafer in the thickness direction of the first pseudo wafer.

Advantageous Effects of Invention

According to the above-described one aspect of the active phased array antenna, the pseudo wafer includes the first feeders for supplying power to the group of semiconductor chips from the substrate; and the second feeder for supplying power to the silicon wafer from the substrate, the second feeder passing through the pseudo wafer in the thickness direction of the pseudo wafer. Thus, power to the Si wafer is separated from power to the compound semiconductor chips.

According to the above-described another aspect of the active phased array antenna, the first pseudo wafer includes the first feeders for supplying power to the first group of semiconductor chips from the substrate; the second feeder for supplying power to the silicon wafer from the substrate, the second feeder passing through the first pseudo wafer in the thickness direction of the first pseudo wafer; and the third feeder for supplying power to the second group of semiconductor chips from the substrate, the third feeder passing through the first pseudo wafer in the thickness direction of the first pseudo wafer. Thus, power to the compound semiconductor chips is separated from power to the Si wafer.

DESCRIPTION OF EMBODIMENTS

Embodiments of the present disclosure will be described below with reference to the accompanying drawings.

First Embodiment

1. Configuration

With reference to FIGS. 1 to 6B, a 3D structured active phased array antenna (APAA) of a first embodiment will be described. First, a configuration of the 3D structured APAA will be described.

<3D Structured Active Phased Array Antenna>

Figure 1:
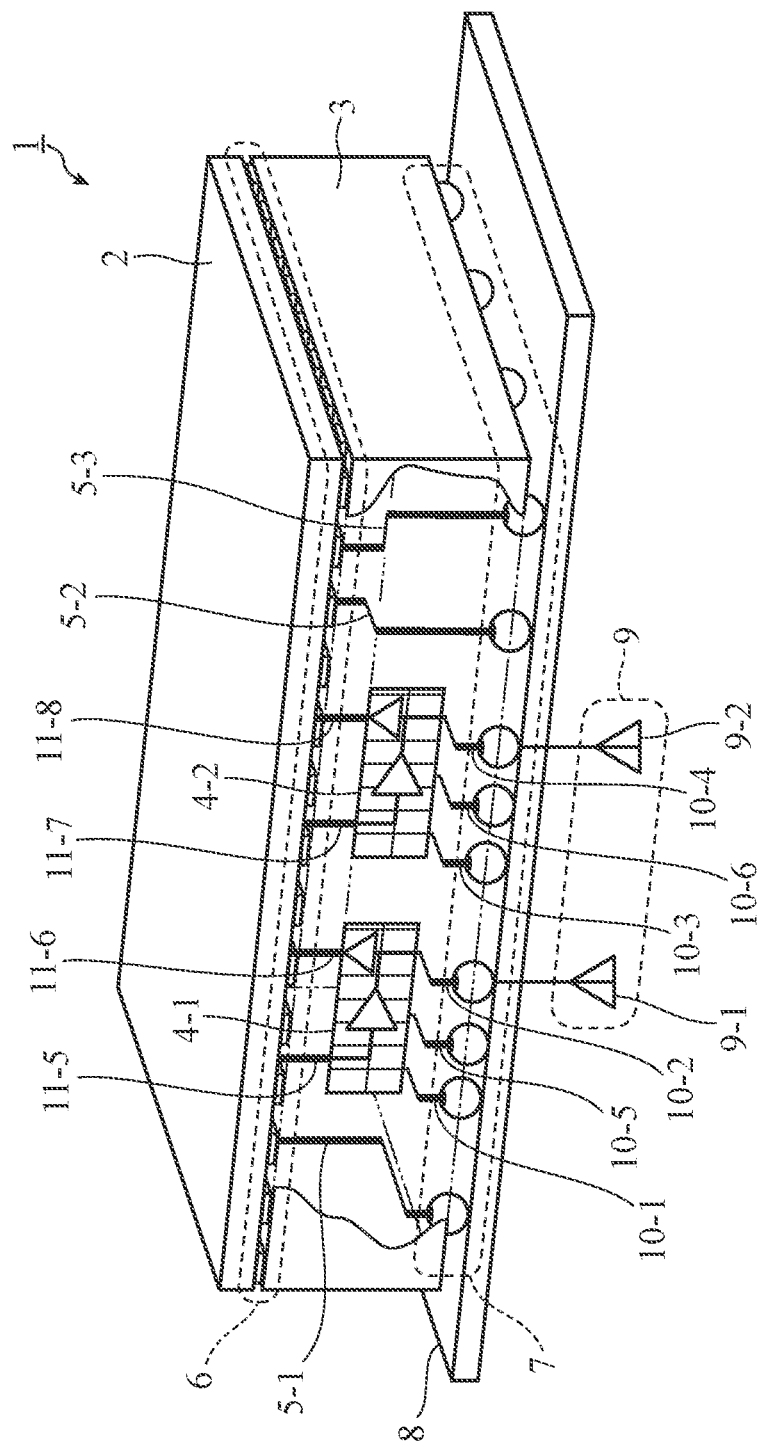
FIG. 1 is a partially cutaway perspective cross-sectional view according to one example of a 3D structured active phased array antenna (APAA) of a first embodiment. Note that circuit elements formed on compound semiconductor chips contained in a pseudo wafer are represented by circuit symbols.

FIG. 1 is a partially cutaway perspective cross-sectional view according to one example of a 3D structured APAA 1 of the first embodiment. As shown in FIG. 1, the 3D structured APAA 1 has a configuration in which a substrate 8 having a plurality of antenna elements 9-1 and 9-2 arranged in an array, a pseudo wafer 3 that contains a group of semiconductor chips including a plurality of semiconductor chips 4-1 and 4-2 which are made of compound semiconductors, and a silicon (Si) wafer 2 made of silicon are stacked on top of each other in this order. The Si wafer 2 and the pseudo wafer 3 are connected to each other through a first connecting structure group 6. The first connecting structure group 6 includes, for example, wiring junctions between metallic wiring lines on the front surface of the Si wafer 2, solder balls, and gold bumps. The pseudo wafer 3 and the substrate 8 are connected to each other through a second connecting structure group 7. The second connecting structure group 7 includes, for example, solder balls and gold bumps. The solder balls and gold bumps do not need to be spherical in shape and may have other shapes. The solder balls and gold bumps may be, for example, cylindrical such as copper posts (copper pillars). An array antenna 9 is formed on the underside of the substrate 8. Examples of the array antenna 9 include a patch array antenna patterned on the substrate 8 and a waveguide slot array antenna having a 3D structure. For one antenna element, one phase shifter is included in the Si wafer 2, and a high power amplifier 12 and a low noise amplifier 13 are included in the pseudo wafer 3. As such, the 3D structured APAA 1 has a configuration of an active phased array antenna having a 3D structure. Each element or component will be described below.

<Si Wafer>

The Si wafer 2 is a wafer made of silicon. The Si wafer 2 includes phase shifters, variable gain amplifiers (VGAs), and a digital control circuit (not shown) that control signals of the 3D structured APAA 1. Devices such as the phase shifters are provided in the Si wafer 2 located on the opposite side of the substrate 8 with the pseudo wafer 3 interposed, thereby widening the antenna plane of the substrate 8.

<Pseudo Wafer>

The pseudo wafer 3 is a pseudo wafer in which the first compound semiconductor chip 4-1 and the second compound semiconductor chip 4-2 are covered with an insulating material. The pseudo wafer 3 can be formed using a technology such as fan out wafer level package (FOWLP) or a component-embedded board. Although FIG. 1 shows only two compound semiconductor chips, the pseudo wafer 3 has compound semiconductor chips (not shown) based on the number of antenna elements arranged in an array.

Circuit elements such as transistors are formed on a surface of each of the first compound semiconductor chip 4-1 and the second compound semiconductor chip 4-2 that faces a substrate 8 side.

The pseudo wafer 3 has a first pseudo wafer pass-through wiring line 5-1, a second pseudo wafer pass-through wiring line 5-2, and a third pseudo wafer pass-through wiring line 5-3 as wiring lines that pass through the pseudo wafer 3 in the thickness direction. In addition, the pseudo wafer 3 has a first via 10-1, a second via 10-2, a third via 10-3, and a fourth via 10-4 as vias that connect the compound semiconductor chips 4 in the pseudo wafer 3 to terminals provided on the front surface of the pseudo wafer 3. In addition, the pseudo wafer 3 has a fifth via 11-5, a sixth via 11-6, a seventh via 11-7, and an eighth via 11-8 as vias that connect the compound semiconductor chips 4 in the pseudo wafer 3 to terminals provided on the rear surface of the pseudo wafer 3.

<Compound Semiconductor Chips>

The first compound semiconductor chip 4-1 and the second compound semiconductor chip 4-2 are chips made of compound semiconductors such as gallium arsenide (GaAs), gallium nitride (GaN), and indium phosphide (InP). The first compound semiconductor chip 4-1 and the second compound semiconductor chip 4-2 each are structured to have input and output terminals for signals on both of the front surface (a surface on the substrate 8 side in FIG. 1) thereof and the rear surface (a surface on a Si wafer 2 side in FIG. 1) thereof. Input and output terminals do not need to be provided on the front and rear surfaces of all compound semiconductor chips. Some input and output terminals on the rear surface of the pseudo wafer 3 are connected to the input and output terminals on the rear surfaces of the first compound semiconductor chip 4-1 and the second compound semiconductor chip 4-2, and some input and output terminals on the substrate 8 side of the pseudo wafer 3 are connected to the input and output terminals on the front surfaces of the first compound semiconductor chip 4-1 and the second compound semiconductor chip 4-2.

Figure 2:
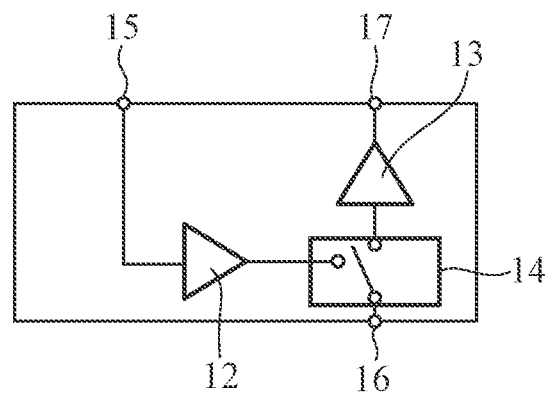
FIG. 2 is a block diagram of the inside of a first compound semiconductor chip and a second compound semiconductor chip of FIG. 1.

The first compound semiconductor chip 4-1 and the second compound semiconductor chip 4-2 are the compound semiconductor chips 4 of the same structure and have a circuit block such as that shown in FIG. 2, for example. As shown in FIG. 2, the compound semiconductor chips 4 each include a high power amplifier 12, a low noise amplifier 13, an SPDT switch 14, a transmission signal input terminal 15, a transmission and reception signal input and output terminal 16, and a reception signal output terminal 17. An input terminal of the high power amplifier 12 is connected to the transmission signal input terminal 15, and an output terminal of the high power amplifier 12 is connected to a first terminal of the SPDT switch 14. A second terminal of the SPDT switch 14 is connected to the transmission and reception signal input and output terminal 16, and a third terminal of the SPDT switch 14 is connected to an input terminal of the low noise amplifier 13. An output terminal of the low noise amplifier is connected to the reception signal output terminal 17 of the compound semiconductor chip 4.

<Vias and Pseudo Wafer Pass-Through Wiring Lines>

Connection of wiring lines from the Si wafer 2 to the first compound semiconductor chip 4-1 and the second compound semiconductor chip 4-2 will be described. Power to and control signals for the Si wafer 2 are supplied from the substrate 8 through the first pseudo wafer pass-through wiring line 5-1, the second pseudo wafer pass-through wiring line 5-2, and the third pseudo wafer pass-through wiring line 5-3. As shown in FIG. 1, the pseudo wafer pass-through wiring lines 5-1 to 5-3 pass through the pseudo wafer 3 in the thickness direction. Which one of the pseudo wafer pass-through wiring lines supplies power or a signal is determined as appropriate. For example, the first pseudo wafer pass-through wiring line 5-1 supplies power, and the second pseudo wafer pass-through wiring line 5-2 and the third pseudo wafer pass-through wiring line 5-3 supply signals. Power to the first compound semiconductor chip 4-1 is supplied from the substrate 8 through the first via 10-1. Likewise, power to the second compound semiconductor chip 4-2 is supplied from the substrate 8 through the third via 10-3. As such, power to the Si wafer 2 and power to the compound semiconductor chips 4 are supplied through different lines. Namely, power separation is implemented.

Figure 3:
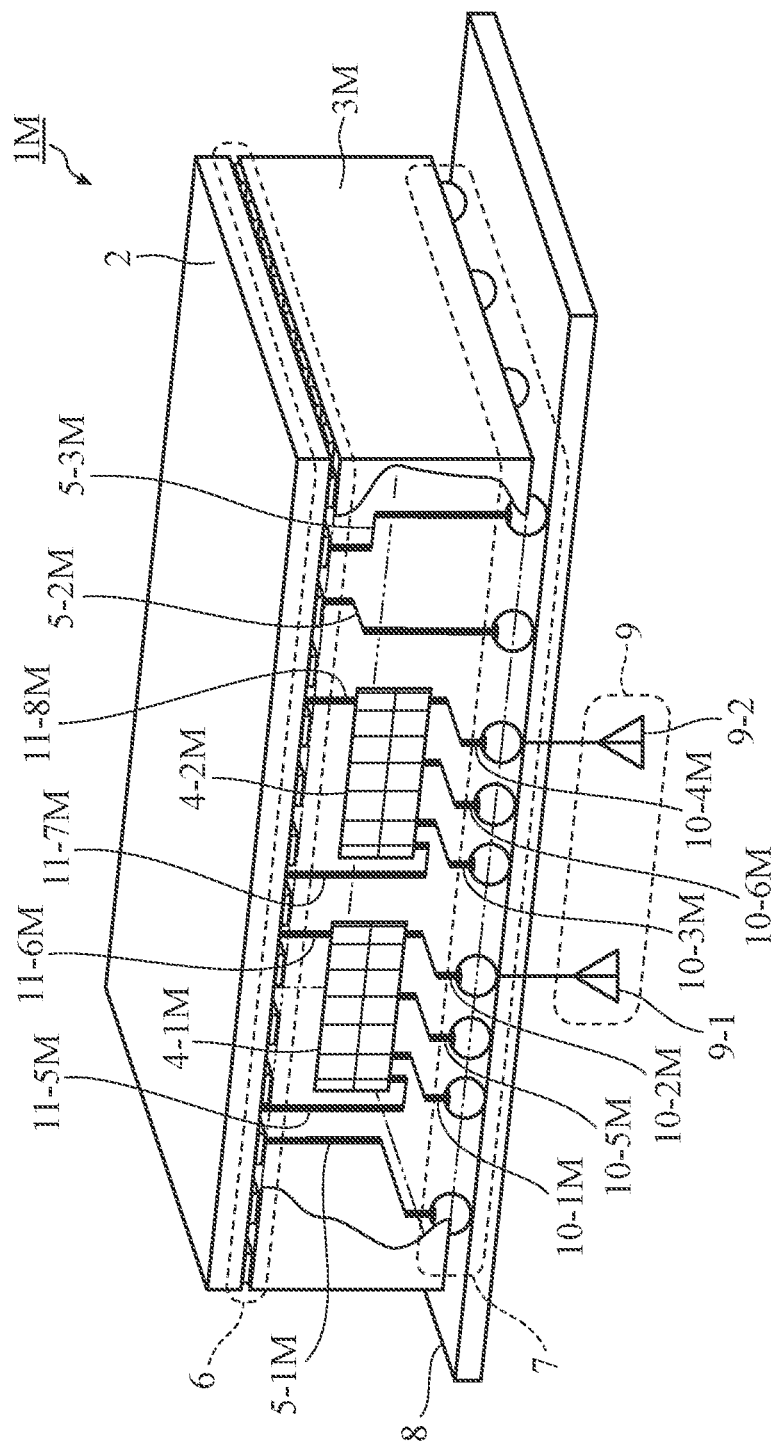
FIG. 3 is a partially cutaway perspective cross-sectional view according to a variant of the 3D structured APAA of FIG. 1. Depiction of circuit elements included in compound semiconductor chips contained in a pseudo wafer is omitted for easy understanding.

Wiring lines to the first compound semiconductor chip 4-1 and the second compound semiconductor chip 4-2 may be changed as shown in FIG. 3. FIG. 3 is a perspective view showing a configuration of a 3D structured APAA 1M which is a variant of the 3D structured APAA 1. In the 3D structured APAA 1 of FIG. 1, the input and output terminals of the first compound semiconductor chip 4-1 and the second compound semiconductor chip 4-2 contained in the pseudo wafer 3 are provided on both of the front and rear surfaces of the first compound semiconductor chip 4-1 and the second compound semiconductor chip 4-2, but as with the 3D structure APAA 1M of FIG. 3, the input and output terminals of each compound semiconductor chip 4 may be provided only on the front surface (a substrate 8 side of FIG. 3) of the compound semiconductor chip 4 (4-1M, 4-2M). In this case, the input and output terminals provided on the front surface of the compound semiconductor chip 4 (4-1M, 4-2M) are connected to terminals provided on the rear surface (a surface on an Si wafer 2 side in FIG. 3) of a pseudo wafer 3M, using multilayer redistribution implemented by redistribution using the FOWLP technology and a via structure (vias 11-5M to 11-8M).

In addition, thermal vias 10-5 and 10-6 that thermally connect a surface of the pseudo wafer 3 facing the substrate 8 to the compound semiconductor chips 4 (4-1, 4-2) may be provided in the pseudo wafer 3. The thermal vias 10-5 and 10-6 do not electrically connect the surface of the pseudo wafer 3 facing the substrate 8 to the compound semiconductor chips 4 (4-1, 4-2). The thermal vias 10-5 and 10-6 are vias for heat dissipation and are made of a material with excellent thermal conductivity such as copper. The thermal vias 10-5 and 10-6 can be formed using the FOWLP technology. The high power amplifiers 12 included in the first compound semiconductor chip 4-1 and the second compound semiconductor chip 4-2 have high power consumption. By providing the thermal vias 10-5 and 10-6, heat generated in the first compound semiconductor chip 4-1 and the second compound semiconductor chip 4-2 can be dissipated to the substrate 8 serving as a heat dissipator.

<Array Antenna>

Figure 5:
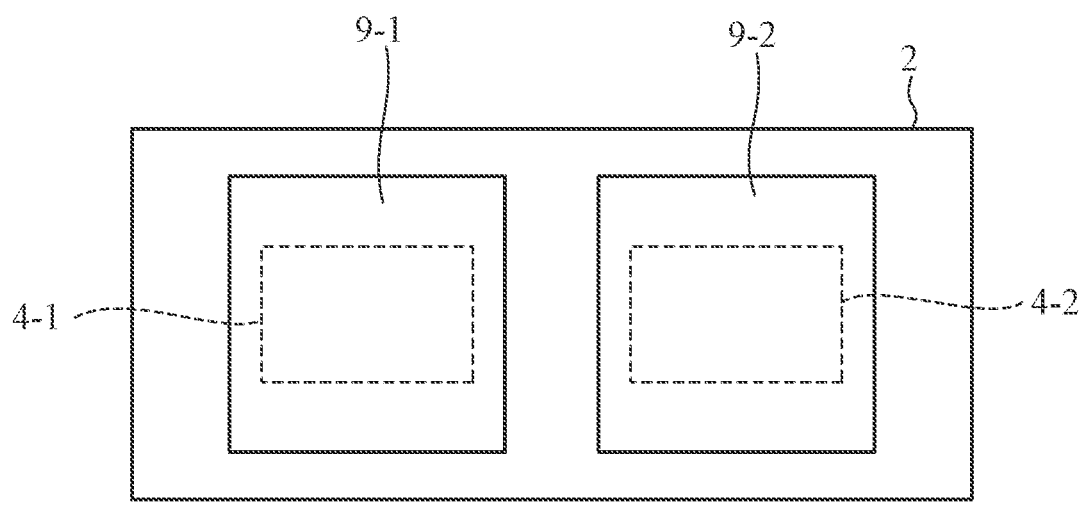
FIG. 5 is a diagram showing a relationship between the areas of a silicon wafer, the compound semiconductor chips, and antenna elements.

The array antenna 9 is an array antenna in which antenna elements are arranged in an array or at regular intervals. Examples of the array antenna 9 include a patch array antenna patterned on the substrate 8 and a waveguide slot array antenna having a 3D structure. Here, with reference to FIG. 5, a relationship between the areas of the Si wafer 2, the compound semiconductor chips 4-1 and 4-2, and the antenna elements 9-1, 9-2 will be described. FIG. 5 is a diagram showing an example of a case in which the array antenna 9 is formed of a plurality of patch antennas, and showing a relationship between the areas of the Si wafer 2, the compound semiconductor chips 4-1 and 4-2, and the antenna elements 9-1, 9-2 as viewed from the front (radiation direction) of the array antenna 9.

As shown in FIG. 5, the area of the Si wafer 2 is greater than or equal to the sum of the areas of antenna planes of two adjacent elements (9-1, 9-2) among the plurality of antenna elements, and the area of each of the compound semiconductor chips 4-1 and 4-2 is smaller than the area of an antenna plane of a corresponding one of the antenna elements 9-1 and 9-2 among the plurality of antenna elements. By having such a relationship, it is easier to provide a feeder through which power is supplied to the Si wafer 2 from the substrate 8 separately from feeders through which power is supplied to the compound semiconductor chips 4-1 and 4-2 from the substrate 8.

2. Operations

Next, transmission and reception operations of the 3D structured APAA 1 will be described. Upon transmission, transmission signals of the APAA 1 generated by the Si wafer 2 are inputted to the first compound semiconductor chip 4-1 and the second compound semiconductor chip 4-2 through the fifth via 11-5 and the seventh via 11-7. The transmission signal inputted to the first compound semiconductor chip 4-1 is inputted to the array antenna 9 formed on the substrate 8 through the high power amplifier 12 and the SPDT switch 14 that are contained in the first compound semiconductor chip 4-1, and the second via 10-2. On the other hand, the transmission signal inputted to the second compound semiconductor chip 4-2 is inputted to the array antenna 9 formed on the substrate 8 through the high power amplifier 12 and the SPDT switch 14 that are contained in the second compound semiconductor chip 4-2, and the fourth via 10-4.

Upon reception, reception signals received by the array antenna 9 are inputted to the respective first compound semiconductor chip 4-1 and second compound semiconductor chip 4-2 through the second via 10-2 and the fourth via 10-4. The reception signal inputted to the first compound semiconductor chip 4-1 is amplified by the low noise amplifier 13 contained in the first compound semiconductor chip 4-1, and is inputted to the Si wafer 2 through the sixth via 11-6. On the other hand, the reception signal inputted to the second compound semiconductor chip 4-2 is amplified by the low noise amplifier 13 contained in the second compound semiconductor chip 4-2, and is inputted to the Si wafer 2 through the eighth via 11-8. In the Si wafer 2, a phase difference, amplitudes, etc., of the received signals are processed by a reception circuit contained in the Si wafer 2.

Figure 4:
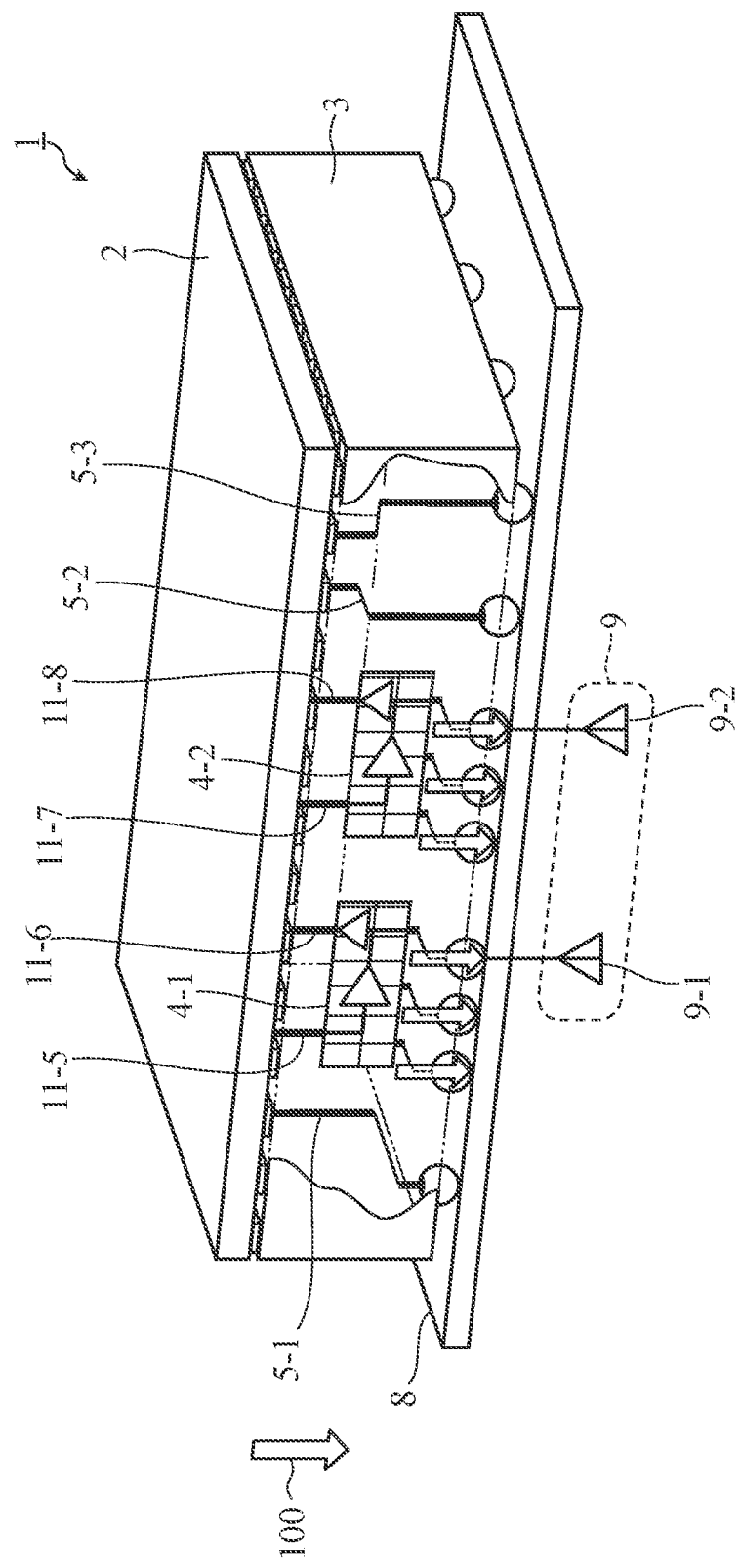
FIG. 4 is a diagram showing heat dissipation paths of the 3D structured APAA of FIG. 1.

Heat generated in the high power amplifiers 12 in the first compound semiconductor chip 4-1 and the second compound semiconductor chip 4-2 is dissipated to the substrate 8 through the thermal vias 10-5 and 10-6 as shown by an arrow 100 of FIG. 4. In addition, vias 10-1M to 10-4M are also in contact with the first compound semiconductor chip 4-1 or the second compound semiconductor chip 4-2 and the substrate 8, and thus, heat generated in the high power amplifiers 12 is dissipated to the substrate 8 also through the vias 10-1M to 10-4M as shown by the arrow 100.

3. Functions and Effects

As described above, the 3D structured APAA 1 includes the vias 10-1 and 10-3 for supplying power to the first compound semiconductor chip 4-1 and the second compound semiconductor chip 4-2 from the substrate 8; and the pseudo wafer pass-through wiring lines 5-1 to 5-3 for supplying power to the Si wafer 2 from the substrate 8. Namely, power to the compound semiconductor chips 4-1 and 4-2 is separated from power to the Si wafer 2. This prevents the heat generated in the compound semiconductor chips 4-1 and 4-2 from affecting the power to the Si wafer 2, and thus the operations of the 3D structured APAA 1 can be more stabilized.

In addition, the area of the Si wafer 2 is greater than or equal to the sum of the areas of antenna planes of two adjacent elements among the plurality of antenna elements, and the area of one compound semiconductor chip among a plurality of compound semiconductor chips is smaller than the area of an antenna plane of one antenna element, and thus, it is easier to provide a feeder through which power is supplied to the Si wafer 2 from the substrate 8 separately from feeders through which power is supplied to the compound semiconductor chips 4-1 and 4-2 from the substrate 8.

Figure 6A:
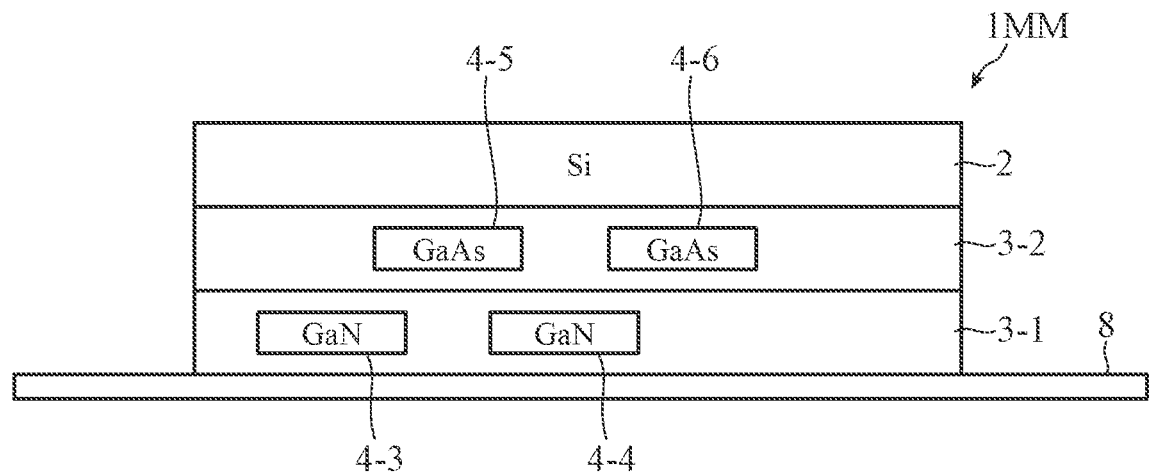
FIG. 6A is a conceptual configuration diagram according to a variant of the 3D structured APAA of FIG. 1.

Although the first embodiment and the variant thereof show a case in which the pseudo wafer and the silicon wafer each have one layer, either one of the wafers may include a plurality of layers. For example, as shown in FIG. 6A, a structure may be adopted in which a plurality of pseudo wafers 3-1 and 3-2 are stacked on top of each other. A 3D structured APAA 1MM of FIG. 6A includes the plurality of pseudo wafers 3-1 and 3-2 arranged between the Si wafer 2 and the substrate 8 having antenna elements. The pseudo wafer 3-1 includes, for example, compound semiconductor chips for transmission 4-3 and 4-4 which are made of GaN, etc., and the pseudo wafer 3-2 includes, for example, compound semiconductor chips for reception 4-5 and 4-6 which are made of GaAs, etc. As in the first embodiment, the Si wafer 2 includes an analog circuit including VGAs, phase shifters, etc., for radio-frequency signal control.

Figure 6B:
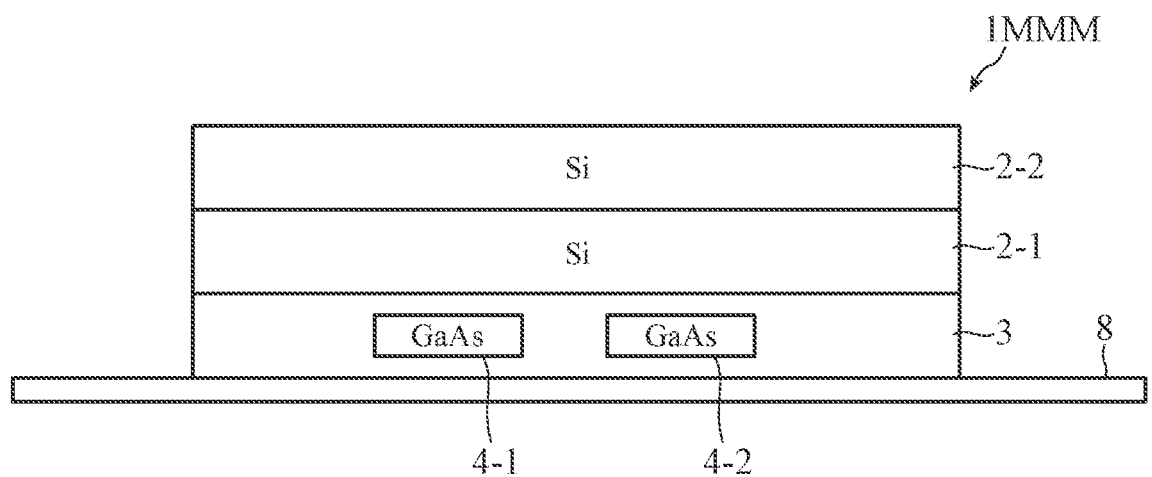
FIG. 6B is a conceptual configuration diagram according to a variant of the 3D structured APAA of FIG. 1.

Alternatively, as shown in FIG. 6B, a structure may be adopted in which a plurality of silicon wafers 2-1 and 2-2 are stacked on top of each other. In a 3D structured APAA 1MMM of FIG. 6B, as in the first embodiment, the pseudo wafer 3 is a pseudo wafer including the compound semiconductors 4-1 and 4-2. The silicon wafer 2-1 includes, for example, an analog circuit including VGAs, phase shifters, etc., for radio-frequency signal control. The silicon wafer 2-2 includes, for example, a digital circuit for controlling the silicon wafer 2-1.

As a still another variant, by combining together a configuration of FIG. 6A and a configuration of FIG. 6B, both of the pseudo wafer and the silicon wafer may include a plurality of layers. Note that for easy understanding, in FIGS. 6A and 6B, depiction of wiring lines and bumps is omitted.

Second Embodiment

Next, with reference to FIGS. 2, 3, and 5 to 8, a 3D structured active phased array antenna of a second embodiment will be described. The same elements or components as those included in the 3D structured APAA 1 of the first embodiment are given the same numbers and an overlapping description is omitted.

1. Configuration

<3D Structured Active Phased Array Antenna>

Figure 7:
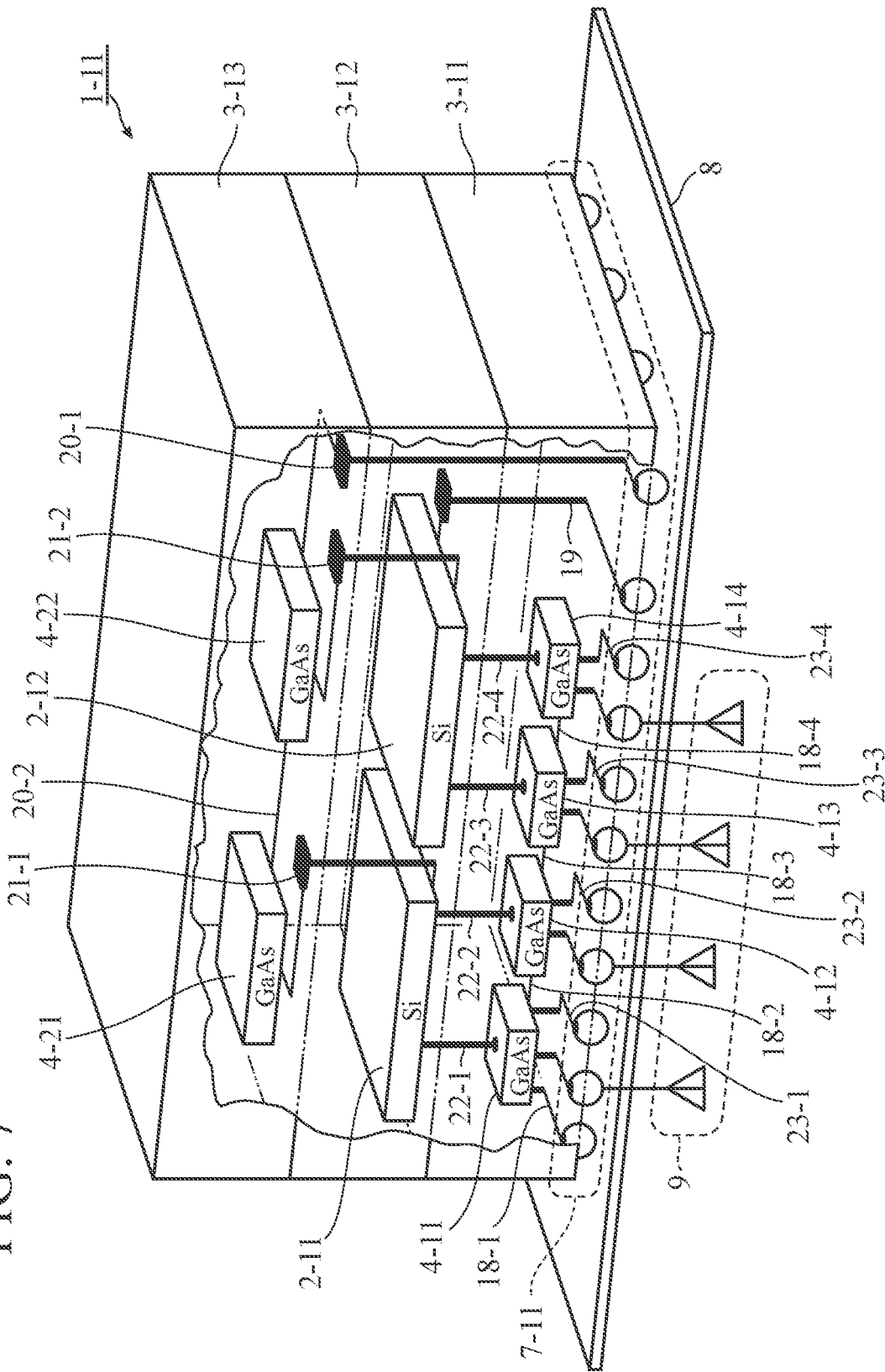
FIG. 7 is a partially cutaway perspective cross-sectional view according to one example of a 3D structured active phased array antenna (APAA) of a second embodiment.

FIG. 7 is a diagram showing a 3D structured APAA 1-11 according to the second embodiment. The 3D structured APAA 1-11 shown in FIG. 7 includes a first pseudo wafer 3-11, a second pseudo wafer 3-12, a third pseudo wafer 3-13, a connecting structure group 7-11, a substrate 8, and an array antenna 9.

<Pseudo Wafers>

The first pseudo wafer 3-11 includes a first GaAs chip 4-11, a second GaAs chip 4-12, a third GaAs chip 4-13, and a fourth GaAs chip 4-14. The first GaAs chip 4-11, the second GaAs chip 4-12, the third GaAs chip 4-13, and the fourth GaAs chip 4-14 each include the high power amplifier 12 and the low noise amplifier 13 such as those shown in FIG. 2. Note that instead of GaAs chips, compound semiconductor chips such as GaN chips and InP chips may be used.

The second pseudo wafer 3-12 includes a first Si wafer 2-11 and a second Si wafer 2-12. In the second embodiment, the Si wafers are also formed as pseudo wafers, and power feeders to the third pseudo wafer 3-13 are provided in a resin layer of the second pseudo wafer 3-12. As in the first embodiment, the area of each of the Si wafers 2-11 and 2-12 contained in the second pseudo wafer 3-12 is greater than the sum of the areas of two adjacent GaAs chips contained in the first pseudo wafer 3-11 (see FIG. 5). The first Si wafer 2-11 and the second Si wafer 2-12 each include a control circuit other than a phase shifter, a variable-gain amplifier, and a VCO in a PLL.

The third pseudo wafer 3-13 includes a first signal source GaAs chip 4-21 and a second signal source GaAs chip 4-22. The first signal source GaAs chip 4-21 and the second signal source GaAs chip 4-22 each include a device such as a voltage controlled oscillator (VCO). Note that instead of GaAs chips, Si chips, GaN chips, InP chips, etc., may be used.

In addition, as described with reference to FIGS. 6A and 6B, the pseudo wafers 3-11 to 3-13 or the silicon wafers 2-11 and 2-12 included in the pseudo wafer 3-12 may also be changed in such a manner that any of the wafers includes a plurality of layers as appropriate. For example, the pseudo wafer 3-11 may be changed in such a manner that the pseudo wafer 3-11 includes, as shown in FIG. 6A, a pseudo wafer having compound semiconductors for transmission and a pseudo wafer having compound semiconductors for reception by providing a plurality of layers in the pseudo wafer 3-11.

<Power Wiring Lines and Signal Wiring Lines>

Wiring lines between the substrate 8, the first pseudo wafer 3-11, the second pseudo wafer 3-12, and the third pseudo wafer 3-13 will be described.

Power to the first GaAs chip 4-11, the second GaAs chip 4-12, the third GaAs chip 4-13, and the fourth GaAs chip 4-14 included in the first pseudo wafer 3-11 is supplied through respective power wiring lines 18-1, 18-2, 18-3, and 18-4. The power wiring lines 18-1, 18-2, 18-3, and 18-4 electrically connect the substrate 8 to the GaAs chips 4-11 to 4-14.

Power to the first Si wafer 2-11 and the second Si wafer 2-12 included in the second pseudo wafer 3-12 is supplied from the substrate 8 through a power wiring line 19 passing through the first pseudo wafer 3-11.

Power to the first signal source GaAs chip 4-21 and the second signal source GaAs chip 4-22 included in the third pseudo wafer 3-13 is supplied from the substrate 8 through a power wiring line 20-1 passing through the first pseudo wafer 3-11 and the second pseudo wafer 3-12, and a power wiring line 20-2 in the third pseudo wafer 3-13.

A radio-frequency signal between the first signal source GaAs chip 4-21 and the first Si wafer 2-11 is supplied through a radio-frequency wiring line 21-1 that connects these elements, and a radio-frequency signal between the second signal source GaAs chip 4-22 and the second Si wafer 2-12 is supplied through a radio-frequency wiring line 21-2 that connects these elements.

A radio-frequency signal between the first Si wafer 2-11 and the first GaAs chip 4-11 is supplied through a radio-frequency wiring line 22-1 that connects these elements, and a radio-frequency signal between the first Si wafer 2-11 and the second GaAs chip 4-12 is supplied through a radio-frequency wiring line 22-2 that connects these elements. In addition, a radio-frequency signal between the second Si wafer 2-12 and the third GaAs chip 4-13 is supplied through a radio-frequency wiring line 22-3 that connects these elements, and a radio-frequency signal between the second Si wafer 2-12 and the fourth GaAs chip 4-14 is supplied through a radio-frequency wiring line 22-4 that connects these elements.

Although in FIG. 7 the input and output terminals of each of the GaAs chips 4-11 to 4-14 are provided on both of the front and rear surfaces of the chip, as shown in the variant of the first embodiment (FIG. 3), the input and output terminals may be arranged only on one surface (front surface) of each chip, and multilayer redistribution may be provided using the FOWLP technology. In this case, the radio-frequency wiring lines 22-1 to 22-4 are routed to the front surfaces of the GaAs chips 4-11 to 4-14 (surfaces of the GaAs chips 4-11 to 4-14 facing antenna elements).

<Thermal Vias>

In addition, as in the case of the first embodiment, in the first pseudo wafer 3-11 there may be provided thermal vias 23-1 to 23-4 that thermally connect a surface of the first pseudo wafer 3-11 facing the substrate 8 to the GaAs chips 4-11 to 4-14.

Figure 8:
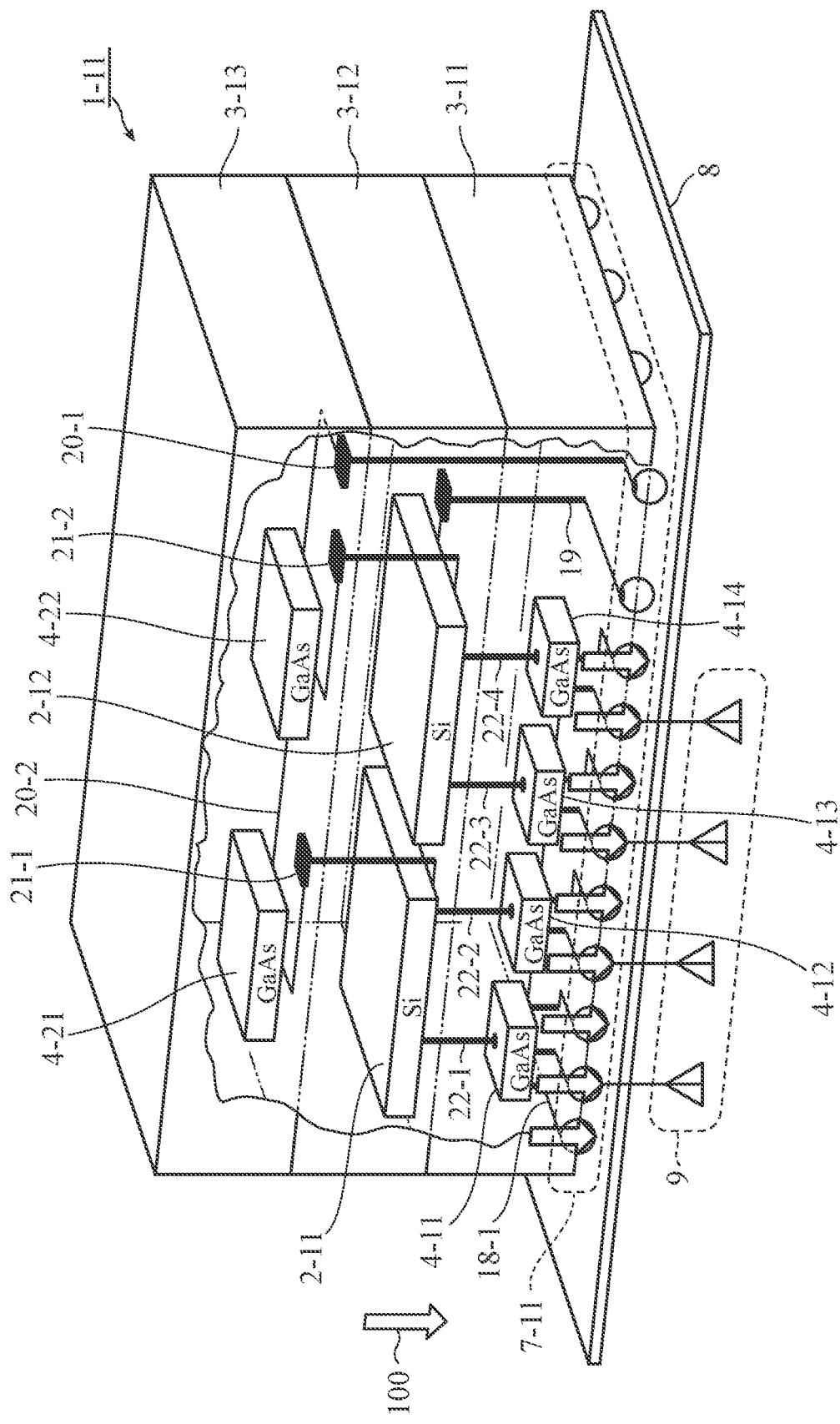
FIG. 8 is a diagram showing heat dissipation paths of the 3D structured APAA of FIG. 7.

FIG. 8 shows heat dissipation paths of the 3D structured APAA 1-11 shown in FIG. 7. The power consumption of the first GaAs chip 4-11, the second GaAs chip 4-12, the third GaAs chip 4-13, and the fourth GaAs chip 4-14 each including the high power amplifier 12 is high. As in the first embodiment, as shown by arrow 100, heat generated in the 3D structured APAA 1-11 is dissipated to the substrate 8 through the thermal vias 23-1 to 23-4. In addition, as in the first embodiment, such heat is dissipated to the substrate 8 also through wiring lines between the GaAs chips 4-11 to 4-14 and a surface of the first pseudo wafer 3-11 facing the substrate 8 (e.g., the power wiring line 18-1 and wiring lines between the GaAs chips 4 and the antenna elements) as shown by the arrow 100.

The 3D structured APAA 1-11 configured in the above-described manner operates in the same manner as the 3D structured APAA 1 according to the first embodiment.

2. Functions and Effects

As described above, the 3D structured APAA 1-11 includes the power wiring lines 18-1 to 18-4 for supplying power to the GaAs chips 4-11 to 4-14 from the substrate 8; the power wiring line 19 for supplying power to the Si wafers 2-11 and 2-12 from the substrate 8, the power wiring line 19 passing through the first pseudo wafer 3-11 in the thickness direction; and the power wiring line 20-1 for supplying power to the signal source GaAs chips 4-21 and 4-22 from the substrate 8, the power wiring line 20-1 passing through the second pseudo wafer 3-12 in the thickness direction. Namely, power to the GaAs chips 4-11 to 4-14, power to the Si wafers 2-11 and 2-12, and power to the signal source GaAs chips 4-21 and 4-22 are separated from each other.

Hence, power to the first Si wafer 2-11 and the second Si wafer 2-12 contained in the second pseudo wafer 3-12 is fed without passing through the GaAs chips 4-11 to 4-14 contained in the first pseudo wafer 3-11. Likewise, power to the first signal source GaAs chip 4-21 and the second signal source GaAs chip 4-22 contained in the third pseudo wafer 3-13 is fed without passing through the first GaAs chips 4-11 to 4-14 contained in the first pseudo wafer 3-11 or the first Si wafer 2-11 or the second Si wafer 2-12 contained in the second pseudo wafer 3-12. Therefore, power used by the signal source GaAs chips 4-21 and 4-22 does not pass through the Si wafers 2-11 and 2-12. This prevents the heat generated in the GaAs chips 4-11 to 4-14 from affecting the power to the Si wafers 2-11 and 2-12 and the power to the signal source GaAs chips 4-21 and 4-22, and thus, the operations of the 3D structured APAA 1-11 can be more stabilized.

Additional Notes

Some aspects of the embodiments of the present disclosure will be summarized below.

<Additional Note 1>

An active phased array antenna (1; 1M) is an active phased array antenna (1; 1M) including a substrate (8) having a plurality of antenna elements (9-1, 9-2); a pseudo wafer (3; 3M) containing a group of semiconductor chips including a plurality of semiconductor chips (4-1, 4-2; 4-1M, 4-2M) made of compound semiconductors; and a silicon wafer (2; 2-11, 2-12) made of silicon, the substrate, the pseudo wafer, and the silicon wafer being stacked on top of each other in this order, and the pseudo wafer includes first feeders (10-1, 10-3; 10-1M, 10-3M) for supplying power to the group of semiconductor chips from the substrate; and a second feeder (5-1 to 5-3; 5-1M to 5-3M) for supplying power to the silicon wafer from the substrate, the second feeder passing through the pseudo wafer in a thickness direction of the pseudo wafer.

<Additional Note 2>

An active phased array antenna of additional note 2 is the active phased array antenna of additional note 1, and the area of the silicon wafer is greater than or equal to the sum of the areas of antenna planes of two adjacent elements among the plurality of antenna elements, and the area of one semiconductor chip among the plurality of semiconductor chips is smaller than the area of an antenna plane of one antenna element among the plurality of antenna elements.

<Additional Note 3>

An active phased array antenna of additional note 3 is the active phased array antenna described in additional note 1 or 2, and the plurality of semiconductor chips includes a semiconductor chip having input and output terminals (15 to 17) formed on both the front and rear surfaces of the semiconductor chip.

<Additional Note 4>

An active phased array antenna of additional note 4 is the active phased array antenna described in additional note 1 or 2, and the plurality of semiconductor chips includes a semiconductor chip having input and output terminals formed only on one surface of the semiconductor chip, and the pseudo wafer has multilayer redistribution (11-5M to 11-8M) that connects the input and output terminals of the semiconductor chip to input and output terminals of the silicon wafer.

<Additional Note 5>

An active phased array antenna of additional note 5 is any one of the active phased array antennas described in additional notes 1 to 4, and the pseudo wafer has a thermal via (10-5, 10-6) that thermally connects, instead of electrically connects, a surface of the pseudo wafer facing the substrate to any one of the semiconductor chips included in the group of semiconductor chips.

<Additional Note 6>

An active phased array antenna (1-11) is an active phased array antenna (1-11) including a substrate (8) having a plurality of antenna elements (9-1, 9-2) formed thereon; a first pseudo wafer (3-11) containing a first group of semiconductor chips including a plurality of semiconductor chips (4-11 to 4-14) made of compound semiconductors; a second pseudo wafer (3-12) containing one or more silicon wafers (2-11, 2-12) made of silicon; and a third pseudo wafer (3-13) containing a second group of semiconductor chips including a plurality of semiconductor chips (4-21, 4-22) made of compound semiconductors, the substrate, the first pseudo wafer, the second pseudo wafer, and the third pseudo wafer being stacked on top of each other in this order, and the first pseudo wafer includes first feeders (18-1 to 18-4) for supplying power to the first group of semiconductor chips from the substrate; a second feeder (19) for supplying power to the one or more silicon wafers from the substrate, the second feeder passing through the first pseudo wafer in a thickness direction of the first pseudo wafer; and a third feeder (20-1) for supplying power to the second group of semiconductor chips from the substrate, the third feeder passing through the first pseudo wafer in the thickness direction of the first pseudo wafer.

<Additional Note 7>

An active phased array antenna of additional note 7 is the active phased array antenna described in additional note 6, and the plurality of semiconductor chips includes a semiconductor chip having input and output terminals (15 to 17) formed on both the front and rear surfaces of the semiconductor chip.

<Additional Note 8>

An active phased array antenna of additional note 8 is the active phased array antenna described in additional note 6, and the plurality of semiconductor chips includes a semiconductor chip having input and output terminals formed only on one surface of the semiconductor chip, and the first pseudo wafer has multilayer redistribution (11-5M to 11-8M) that connects the input and output terminals of the semiconductor chip to input and output terminals of the silicon wafer.

<Additional Note 9>

An active phased array antenna of additional note 9 is any one of the active phased array antennas described in additional notes 6 to 8, and the first pseudo wafer has a thermal via (23-1 to 23-4) that thermally connects, instead of electrically connects, a surface of the first pseudo wafer facing the substrate to any one of the semiconductor chips included in the first group of semiconductor chips.

<Additional Note 10>

An active phased array antenna of additional note 10 is any one of the active phased array antennas described in additional notes 6 to 9, and the third feeder passes through the second pseudo wafer in a thickness direction of the second pseudo wafer.

Note that the embodiments may be combined together or may be modified, and any component may be omitted.

INDUSTRIAL APPLICABILITY

In an active phased array antenna of the present disclosure, power to devices for allowing the active phased array antenna to operate is separated. Thus, the active phased array antenna of the present disclosure can be used as an active phased array antenna whose operations are more stabilized.

REFERENCE SIGNS LIST 1 (1; 1M; 1-11): 3D structured active phased array antenna, 2 (2; 2-11; 2-12): silicon wafer, 3 (3; 3-11; 3-12; 3-13): pseudo wafer, 4 (4-1; 4-2): compound semiconductor chip, 4-11 to 4-14: GaAs chip (compound semiconductor chip), 4-21; 4-22: signal source GaAs chip, 5 (5-1 to 5-3): pseudo wafer pass-through wiring line, 8: substrate, 9: array antenna, 9-1; 9-2: antenna element, 10-5; 10-6: thermal via, 11-5M to 11-8M: via (multilayer redistribution), 15: transmission signal input terminal (input and output terminal), 16: transmission and reception signal input and output terminal (input and output terminal), 17: reception signal output terminal (input and output terminal), 18-1 to 18-4: power wiring line (first feeder), 19: power wiring line (second feeder), 20-1: power wiring line (third feeder), and 23-1 to 23-4: thermal via

The invention claimed is:

1. An active phased array antenna comprising:
a substrate having a plurality of antenna elements;
a pseudo wafer containing a group of semiconductor chips including a plurality of semiconductor chips made of compound semiconductors; and
a silicon wafer made of silicon, the substrate, the pseudo wafer, and the silicon wafer being stacked on top of each other in this order, wherein
the pseudo wafer includes:
first feeders to supply power to the group of semiconductor chips from the substrate; and
a second feeder to supply power to the silicon wafer from the substrate, the second feeder passing through the pseudo wafer in a thickness direction of the pseudo wafer.

2. The active phased array antenna according to claim 1, wherein
an area of the silicon wafer is greater than or equal to a sum of areas of antenna planes of two adjacent elements among the plurality of antenna elements, and
an area of one semiconductor chip among the plurality of semiconductor chips is smaller than an area of an antenna plane of one antenna element among the plurality of antenna elements.

3. The active phased array antenna according to claim 1, wherein the plurality of semiconductor chips includes a semiconductor chip having input and output terminals formed on both front and rear surfaces of the semiconductor chip.

4. The active phased array antenna according to claim 2, wherein the plurality of semiconductor chips includes a semiconductor chip having input and output terminals formed on both front and rear surfaces of the semiconductor chip.

5. The active phased array antenna according to claim 1, wherein the plurality of semiconductor chips includes a semiconductor chip having input and output terminals formed only on one surface of the semiconductor chip, and the pseudo wafer has multilayer redistribution to connect the input and output terminals of the semiconductor chip to input and output terminals of the silicon wafer.

6. The active phased array antenna according to claim 2, wherein the plurality of semiconductor chips includes a semiconductor chip having input and output terminals formed only on one surface of the semiconductor chip, and
the pseudo wafer has multilayer redistribution to connect the input and output terminals of the semiconductor chip to input and output terminals of the silicon wafer.

7. The active phased array antenna according to claim 1, wherein the pseudo wafer has a thermal via to thermally connect, instead of electrically connect, a surface of the pseudo wafer facing the substrate to any one of the semiconductor chips included in the group of semiconductor chips.

8. An active phased array antenna comprising:
a substrate having a plurality of antenna elements formed thereon;
a first pseudo wafer containing a first group of semiconductor chips including a plurality of semiconductor chips made of compound semiconductors;
a second pseudo wafer containing one or more silicon wafers made of silicon; and
a third pseudo wafer containing a second group of semiconductor chips including a plurality of semiconductor chips made of compound semiconductors, the substrate, the first pseudo wafer, the second pseudo wafer, and the third pseudo wafer being stacked on top of each other in this order, wherein
the first pseudo wafer includes:
first feeders to supply power to the first group of semiconductor chips from the substrate;
a second feeder to supply power to the one or more silicon wafers from the substrate, the second feeder passing through the first pseudo wafer in a thickness direction of the first pseudo wafer; and
a third feeder to supply power to the second group of semiconductor chips from the substrate, the third feeder passing through the first pseudo wafer in the thickness direction of the first pseudo wafer.

9. The active phased array antenna according to claim 8, wherein the plurality of semiconductor chips includes a semiconductor chip having input and output terminals formed on both front and rear surfaces of the semiconductor chip.

10. The active phased array antenna according to claim 8, wherein the plurality of semiconductor chips includes a semiconductor chip having input and output terminals formed only on one surface of the semiconductor chip, and
the first pseudo wafer has multilayer redistribution to connect the input and output terminals of the semiconductor chip to input and output terminals of the silicon wafer.

11. The active phased array antenna according to claim 8, wherein the first pseudo wafer has a thermal via to thermally connect, instead of electrically connect, a surface of the first pseudo wafer facing the substrate to any one of the semiconductor chips included in the first group of semiconductor chips.

12. The active phased array antenna according to claim 9, wherein the first pseudo wafer has a thermal via to thermally connect, instead of electrically connect, a surface of the first pseudo wafer facing the substrate to any one of the semiconductor chips included in the first group of semiconductor chips.

13. The active phased array antenna according to claim 10, wherein the first pseudo wafer has a thermal via to thermally connect, instead of electrically connect, a surface of the first pseudo wafer facing the substrate to any one of the semiconductor chips included in the first group of semiconductor chips.

14. The active phased array antenna according to claim 8, wherein the third feeder passes through the second pseudo wafer in a thickness direction of the second pseudo wafer.

* * * * *